United States Patent [19]
Wu

[11] Patent Number: 6,137,152
[45] Date of Patent: *Oct. 24, 2000

[54] PLANARIZED DEEP-SHALLOW TRENCH ISOLATION FOR CMOS/BIPOLAR DEVICES

[75] Inventor: Shye-Lin Wu, Hsinchu, Taiwan

[73] Assignee: Texas Instruments - Acer Incorporated, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/064,976

[22] Filed: Apr. 22, 1998

[51] Int. Cl.$^7$ .................................................. H01L 29/00
[52] U.S. Cl. .......................... 257/510; 257/506; 257/513
[58] Field of Search .................................. 257/506, 510, 257/513; 438/424, 426, 427, 430, 431, 432, 433

[56] References Cited

U.S. PATENT DOCUMENTS

| | | | |
|---|---|---|---|
| 4,472,240 | 9/1984 | Kameyama | 257/510 |
| 5,298,450 | 3/1994 | Verret | 438/427 |
| 5,358,891 | 10/1994 | Tsang et al. | 438/433 |
| 5,385,861 | 1/1995 | Bashir et al. | 438/432 |
| 5,387,540 | 2/1995 | Poon et al. | 438/433 |
| 5,411,913 | 5/1995 | Bashir et al. | 438/432 |
| 5,433,794 | 7/1995 | Fazan et al. | 257/506 |
| 5,474,953 | 12/1995 | Shimizu et al. | 438/426 |
| 5,536,675 | 7/1996 | Bohr | 438/427 |
| 5,576,241 | 11/1996 | Sakai | 438/432 |
| 5,763,315 | 6/1998 | Benedict et al. | 438/424 |

OTHER PUBLICATIONS

A.E.T. Kuiper et al., *Oxidation Behaviour of LPCVD Silicon Oxynitride Films*, Applied Surface Science 33/34, 1988, pp. 757–764.

R. Bashir et al., PLATOP: *A Novel Planarized Trench Isolation and Field Oxide Formation Using Poly–Silicon*, IEEE Electron Device Letters, vol. 17, No. 7, Jul. 1996, pp. 352–354.

*Primary Examiner*—Sara Crane
*Attorney, Agent, or Firm*—Harness, Dickey & Pierce, P.L.C.

[57] ABSTRACT

The trench isolation structure in the present invention is as follows. A lower-half trench is in the substrate. An upper-half trench in the substrate is located above the lower-half trench and the upper-half trench has a larger width than the lower-half trench. A first insulating layer is right above the lower-half trench and the upper-half trench. A second insulating layer is located over the first insulating layer. A semiconductor layer is within the lower-half trench over a portion of the second insulating layer. A third insulating layer is located on the second insulating layer and the semiconductor layer and is located within the upper-half trench. The planarized deep-shallow trench isolation in the present invention can be employed for isolating CMOS and bipolar devices. A higher packing density than conventional trench isolation is provided.

3 Claims, 5 Drawing Sheets

PLANARIZED DEEP-SHALLOW TRENCH ISOLATION FOR CMOS/BIPOLAR DEVICES

FIELD OF THE INVENTION

The present invention relates to a semiconductor device structure and manufacturing process, and more specifically to a planarized deep-shallow trench isolation for CMOS/bipolar devices.

BACKGROUND OF THE INVENTION

In integrated circuits, a great number of devices and circuits are fabricated on a single chip. Various kinds of devices like transistors, resistors, and capacitors are formed together. Each device must operate independently without interfering with each other, especially under the higher and higher packing density of the integrated circuits. An isolation region is formed on the semiconductor substrate for separating different devices or different functional regions. The isolation region is generally a non-active and insulated region for isolating between devices, wells, and functional regions.

LOCOS (local oxidation of silicon) is a widely applied technology in forming the isolation region. The isolation regions are created by oxidizing the portion of the silicon substrate between each active devices and functional regions. The LOCOS technology provide the isolation region with a simple manufacturing process and low cost, especially when compared with other trench isolation processes. However, with the fabrication of semiconductor integrated circuits becomeing densely packed, the application of the LOCOS technology is quite limited. For highly packed circuits like the circuits with devices of deep sub-micrometer feature sizes, the LOCOS process has several challenges in fulfilling the isolating and packing density specifications.

The trench isolation process, or the shallow trench isolation (STI) process, is another isolation process proposed especially for semiconductor chips with high packing density. A trench region is formed in the semiconductor with a depth deep enough for isolating the devices or different wells. In general, a trench is etched and refilled with insulating materials by the trench isolation formation process. The refilled trench regions are employed for the application in the VLSI and ULSI level. In addition, capacitors can also be formed within the trench by filling both insulating and conductive materials sequentially for the application of forming memory cells.

Shallow trench isolation has emerged as the solution for deep sub-micron transistor isolation due to its scalability, planar topography and potentially low thermal budget. In U.S. Pat. No. 5,443,794 to Fazan et al., a method for using spacers to form isolation trenches with improved corners is proposed. They mention that the limits of the standard LOCOS process have motivated the search for and the development of new isolation schemes. The trench isolation is a promising candidate as it uses a fully recessed oxide, has no bird's beak, is fully planar, and does not suffer from the field oxide thinning effect. A smooth trench profile with a self-aligned cap or dome is created in their invention.

For providing better insulating characteristics, a deep trench isolation scheme has been reported. The deep trench isolation increases the packing density and improve the latch-up immunity in CMOS (complementary metal oxide semiconductor)/bipolar devices. R. Bashir and F. Hebert disclosed a planarized trench isolation and field oxide formation using poly-silicon (PLATOP) in their work: "PLATOP: A Novel Planarized Trench Isolation and Field Oxide Formation Using Poly-Silicon" (IEEE Electron Device Letters, vol. 17, no. 7, 1996). It is disclosed that a process highly applicable to high density and high performance CMOS/bipolar processes is needed. The process should not suffer from the conventional limitations of LOCOS-based isolation. The deep trench isolation is finding abundant use in semiconductor processes to increase packing density and latch-up immunity. The difficulties reported include lateral encroachment by bird's beak, formation of thick oxide, combination of deep trench and field isolation, and area and loading effects of planarization process.

In U.S. Pat. No. 5,474,953 to Shimizu et al., a method is reported for forming an isolation region comprising a trench isolation region and a selective oxidation film involved in a semiconductor device. A semiconductor device including both emitter coupled logic circuits (ECL circuits) involving super high speed performance bipolar transistors and super high integrated CMOS circuits with a low power consumption has been developed and known in the art. Both the CMOS and the bipolar devices are formed on a single chip. Thus, isolation structures fulfilling the needs of the various devices and circuits is highly demanded for providing designed functionality of the circuits.

SUMMARY OF THE INVENTION

A trench isolation structure is disclosed in the present invention. The planarized deep-shallow trench isolation can be employed for isolating CMOS and bipolar devices. A higher packing density than conventional trench isolation is provided. The method in the present invention forms the planarized deep-shallow trench isolation with reduced number of masks. Thus, the efforts and cost in the manufacturing process can be saved.

The trench isolation structure in the present invention is as follows. A lower portion trench is in the substrate. An upper portion trench in the substrate is located above the lower portion trench and the upper portion trench has a larger width than the lower portion trench. A first insulating layer is right above the lower portion trench and the upper portion trench. A second insulating layer is located over the first insulating layer. A semiconductor layer is within the lower portion trench over a portion of the second insulating layer. A third insulating layer is located on the second insulating layer and the semiconductor layer and is located within the upper portion trench.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposes a trench isolation structure and a method to form the deep and shallow trench isolation. An upper portion shallow trench is formed followed by the formation of a lower portion deep trench with narrower width, by the defining of a sidewall structure. An oxynitride layer can be used for better dielectric characteristics. By the structure and the method in the present invention, the packing density and latch-up immunity of CMOS/bipolar circuits can be improved. The number of masks can also be reduced by the formation of the sidewall structure as an etching mask of the lower portion deep trench.

Figure 1:
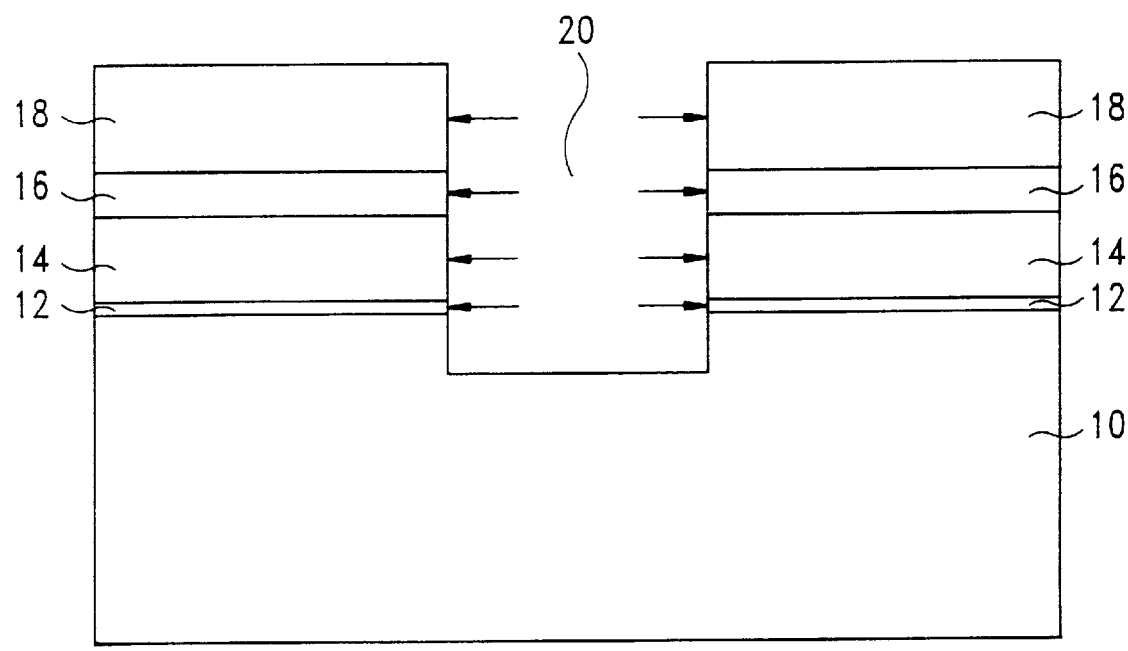
FIG. 1 illustrates a cross-sectional view of forming an upper portion of a trench in accordance with the present invention.

Referring to FIG. 1, a semiconductor substrate 10 is provided for forming isolation region and the active devices. In general, a silicon substrate with a preferable single crystalline silicon in a <100> direction can be used. For different specifications, other substrates with different crystalline orientations or materials can also be used. A pad layer 12 is formed over the semiconductor substrate 10. An example of first pad layer 12 is an oxide layer which is grown thermally from the semiconductor substrate 10 in an oxygen containing ambient. The thickness of the oxide layer can be about 150 angstroms to about 1,000 angstroms. The pad oxide layer 12 is employed to relieve the stress of a first stacked layer formed later. Thus the induced stress by the difference in thermal expansion coefficients between adjacent layers can be relived by applying a pad layer 12 in-between.

A first stacked layer 14 is then formed over the pad layer 12. In the case, a nitride layer which is formed by chemical vapor deposition is employed as the stacked layer 14. Following the formation of the first stacked layer 14, a second stacked layer 16 is formed over. The second stacked layer 16 is selected with the materials having a high selectivity when the substrate 10 is etched for forming a trench. Therefore, the critical dimension can be followed accurately by maintaining the dimension of the masking second stacked layer 16 with high etching selectivity. An oxide layer formed by chemical vapor deposition is used as the second stacked layer 16 in the preferred embodiment. The combination of the second stacked layer 16, the first stacked layer 14, and the first pad layer 12 serves as a masking layer for defining the active region.

An opening 20 is then defined in the second stacked layer 16, the first stacked layer 14, and the pad layer 12. The opening 20 is defined extending down to the substrate 10. The opening 20 defines the region for forming an upper portion trench. The region cover by the pad layer 12 are utilized to form active devices like CMOS or bipolar transistors. Generally speaking, the opening 20 can be defined with a patterning process including a lithography process and an etching process. A photoresist layer 18 is formed over the second stacked layer 16. The lithography process transfers a desired pattern on a mask to the photoresist layer 18. The etching process like a reactive ion etching (RIE) process can be employed to anisotropically etch the second stacked layer 16, the first stacked layer 14, and the pad layer 12. A wide range of the width can be defined with different specifications and feature sizes. As an example, the width of the opening 20 can be 0.5 micrometer to 0.15 micrometer. For circuits with high integrity, a minimum width under the limitation of the lithography technology can be defined.

Next, a portion of the substrate 10 is removed for forming an upper portion of a trench by using the photoresist layer 18 and the second stacked layer 16 as a mask, as shown in FIG. 1. The upper portion of the trench is a shallow trench region. The depth of the shallow trench region under the substrate surface 10 between 500 angstroms to 3,000 angstroms in the case. The photoresist layer 18 is then removed.

Figure 2:
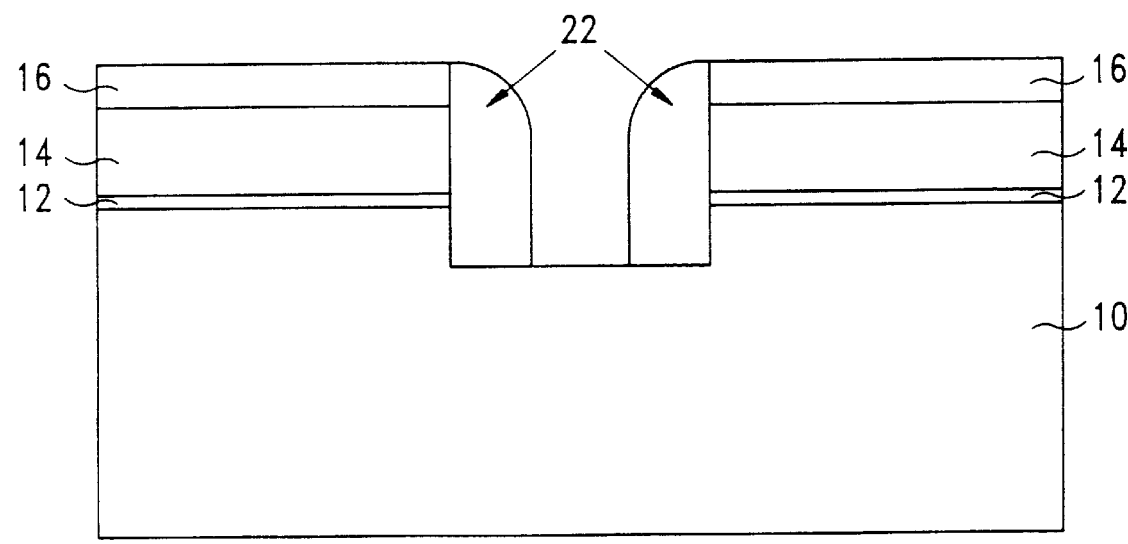
FIG. 2 illustrates a cross-sectional view of forming a sidewall structure on the opening in accordance with the present invention.

Turning to FIG. 2, a sidewall structure 22 is then formed on the opening 20. More particularly, the sidewall structure 22 is formed on the sidewall of the second stacked layer 16, the first stacked layer 14, the pad layer 12, and the shallow trench. In the preferred embodiment, the sidewall structure 22 can be an oxide sidewall structure. An oxide layer is formed over the shallow trench and the second stacked layer 16. The oxide sidewall spacers 22 is then formed by etching back the oxide layer. The spacers can be formed with a thickness of several hundred to several thousand angstroms on each side. Thus a deep trench region narrower than 0.1 micrometer can be defined.

Figure 3:
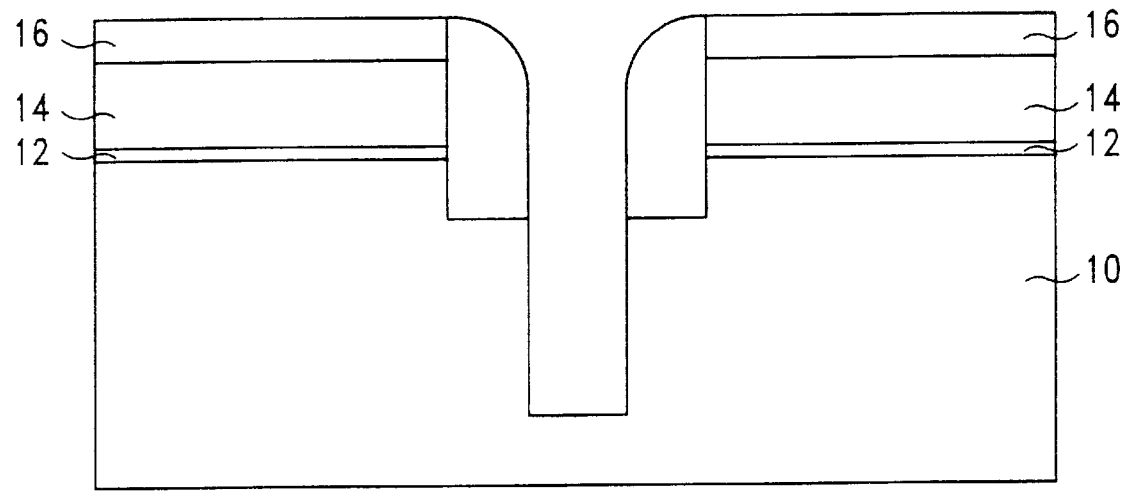
FIG. 3 illustrates a cross-sectional view of forming a lower portion of the trench in accordance with the present invention.

Referring to FIG. 3, a portion of the substrate 10 is removed for forming a lower portion of the trench. The sidewall structure 22 is used as a mask and a deep trench is formed by etching into the substrate 10. Preferably, an anisotropic etching process like a reactive ion etching can be used. In the case, the deep trench can be etched with a wide range of depth between about 300 angstroms to 10 micrometer.

Figure 4:
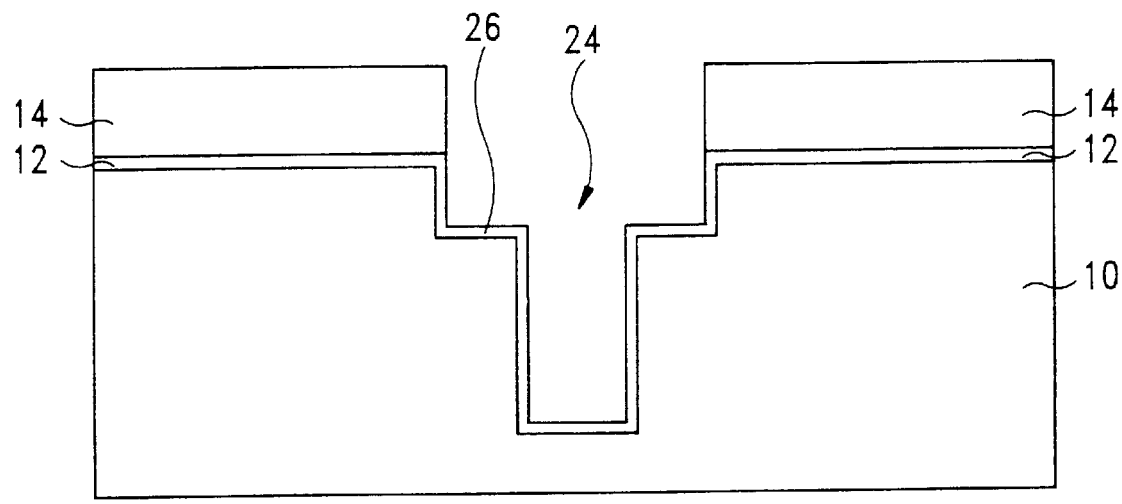
FIG. 4 illustrates a cross-sectional view of forming a first insulating layer over the trench in accordance with the present invention.

The sidewall structure 22 and the second stacked layer 16 are then removed, as shown in FIG. 4. With the oxide material in the case, a wet etching with a HF (Hydrofluoric acid) containing solution like BOE solution can be used. The shallow-deep trench is thus exposed. A first insulating layer 26 is then formed over the trench 24 conformably to the top surface. In such case, the first insulating layer 26 can be an oxide layer which is grown thermally from the substrate 10. The first insulating layer 26 can be grown with a thin thickness thus the stress induced defects by the bird's beak effect on the active region can be eliminated. The thickness of the oxide layer 26 is between about 30 angstroms to about 200 angstroms.

Figure 5:
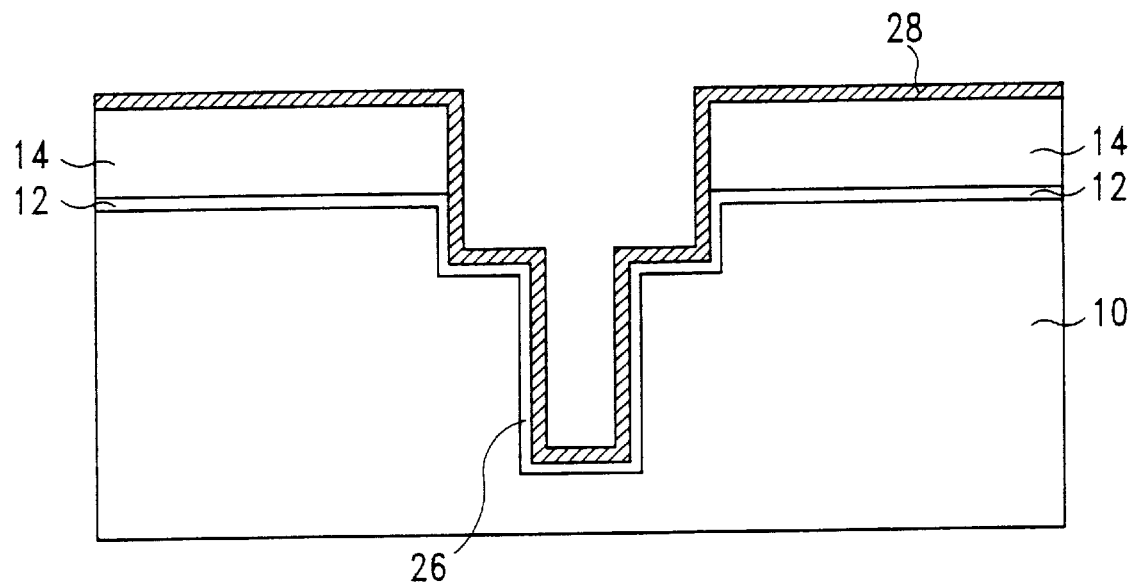
FIG. 5 illustrates a cross-sectional view of forming a second insulating layer over the first insulating layer and over the first stacked layer in accordance with the present invention.

Referring to FIG. 5, a second insulating layer 28 is then formed over the first insulating layer 26 and over the first stacked layer 14. In addition to the thin oxide layer 26, the second insulating layer 28 is provided to improve the insulating characteristics of the trench isolation. In the case, an oxynitride layer formed by chemical vapor deposition is used. More specifically, the oxynitride layer 28 can be formed by LPCVD (low pressure chemical vapor deposition). The oxynitride layer 28 provides good dielectric characteristics with low stress problem to the underlying layers of the oxide layer 26 and the substrate 10. The oxynitride layer 28 also serves as an oxidation buffer layer.

With the protection of the oxynitride layer 28, the substrate 10 can be protected from oxidation in an oxidation process performed later.

In the work "Oxidation behaviour of LPCVD silicon oxynitride films" (Applied Surface Science 33/34, p. 757, 1988), the oxidation buffer effect is disclosed by A. E. T. Kuiper et al. It is found that the oxidation of oxynitride is at least one order of magnitude smaller than that of silicon. Layers with a composition near O/N=0.4 were found to have the greatest oxidation resistance.

Figure 6:
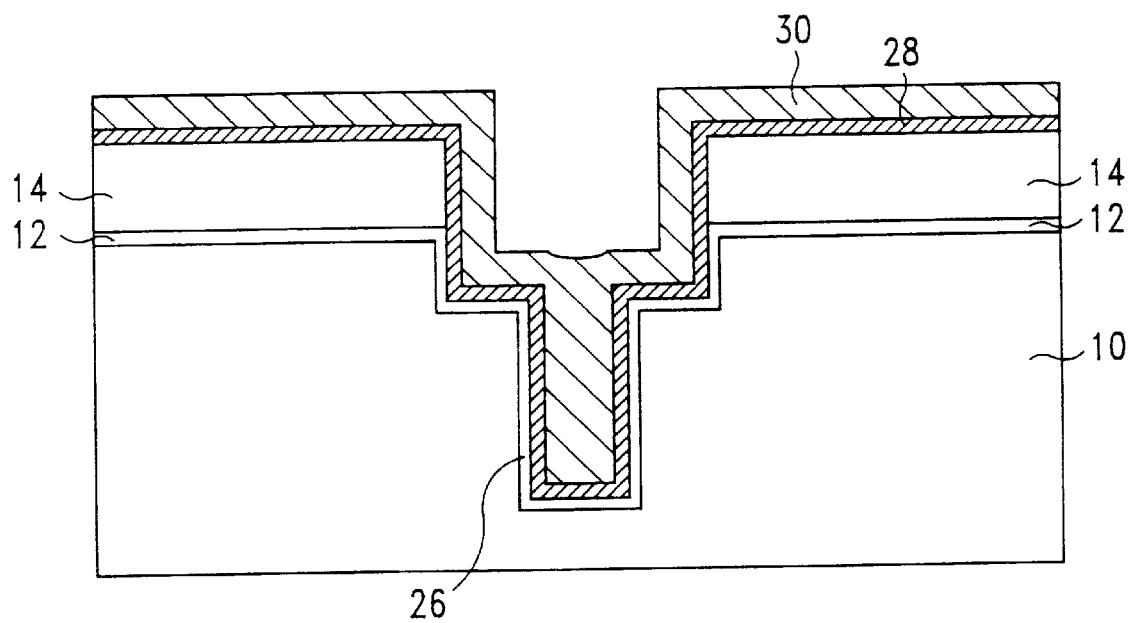
FIG. 6 illustrates a cross-sectional view of forming a semiconductor layer over the second insulating layer in accordance with the present invention.

A semiconductor layer 30 is then formed over the second insulating layer 28, as shown in FIG. 6. The semiconductor layer 30 can be an undoped amorphous silicon layer which is formed by chemical vapor deposition. The undoped amorphous silicon layer 30 is formed with good step coverage, thus the trench can be filled without unreached space or hole defects. A chemical vapor deposition like a LPCVD process can be applied with reduced temperature between about 400° C. to about 650° C.

Figure 7:
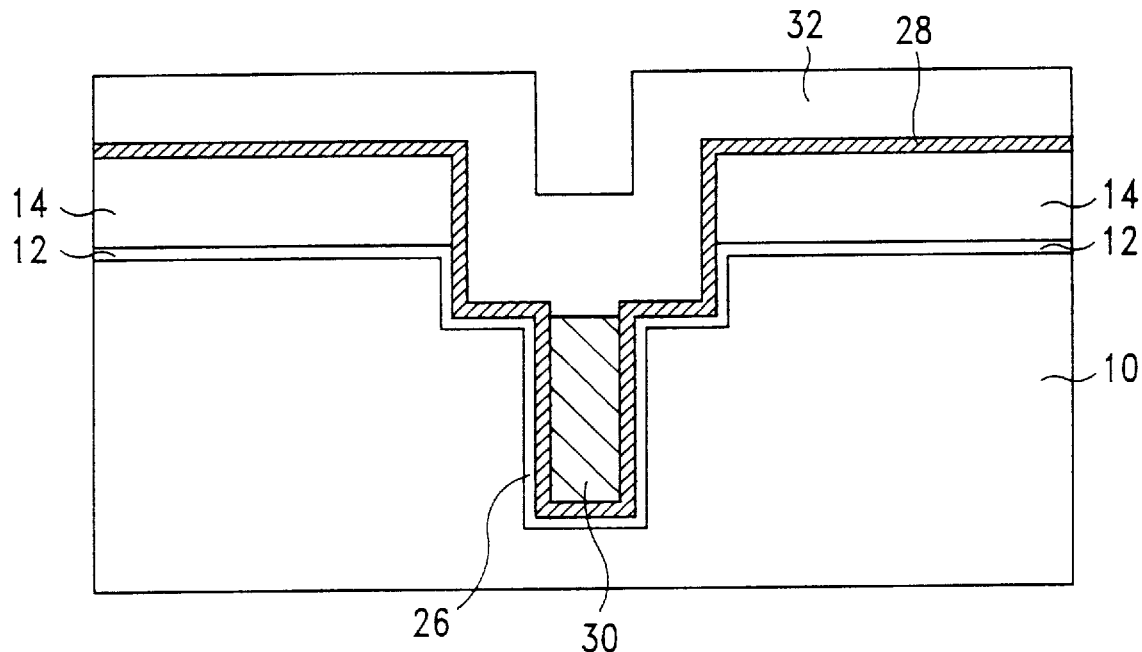
FIG. 7 illustrates a cross-sectional view of oxidizing a portion of the semiconductor layer for forming a third insulating layer in accordance with the present invention.

Referring to FIG. 7, a portion of the silicon layer 30 is oxidized for forming a third insulating layer 32. A high temperature steam oxidation process with a temperature between about 800° C. to about 1150° C. is employed. In such case, a portion of the silicon layer 30 in the shallow trench region is oxidized and another portion of the silicon layer 30 in the deep trench region is left without oxidization. The amorphous silicon in the deep trench region is transformed to poly crystalline silicon under the high temperature of the oxidization process.

Figure 8:
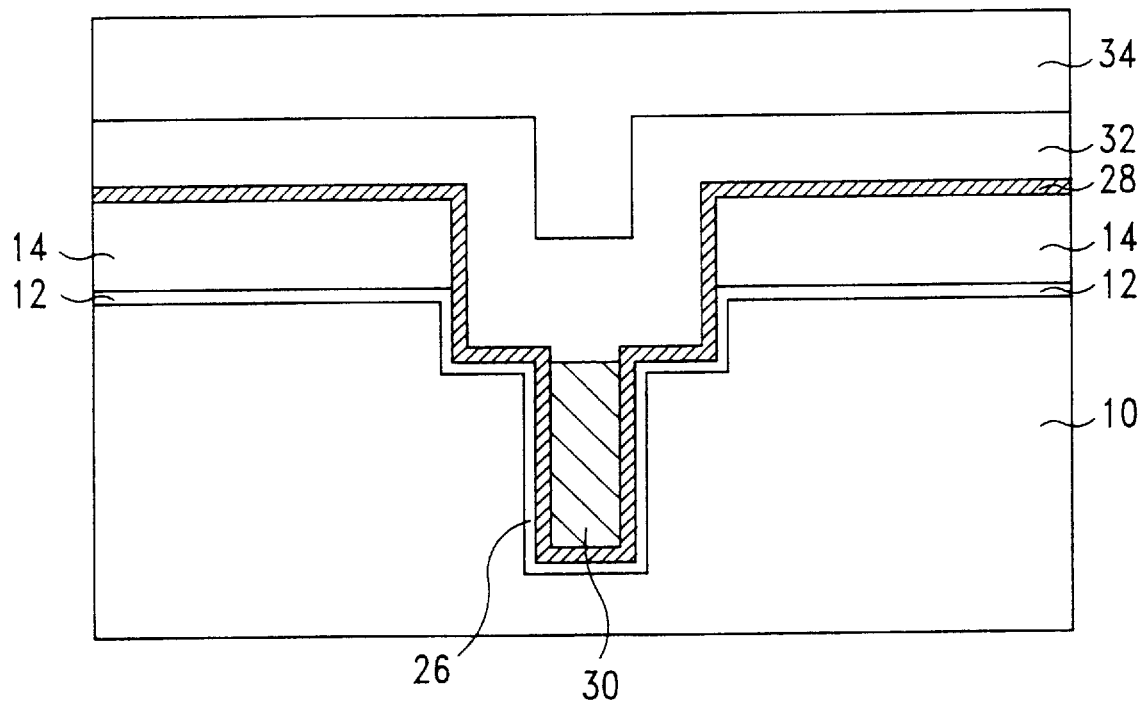
FIG. 8 illustrates a cross-sectional view of forming a filling layer over the third insulating layer in accordance with the present invention.

Next, a filling layer 34 is formed over the substrate 10, as shown in FIG. 8. The filling layer is selected with the materials having similar removal rates with the third insulating layer 32, namely the thermal oxide layer. Thus, a uniform planarization process can be performed to provide planar topography in a later step. In such case, a BPSG (borophosphosilicate) or a SOG (spin-on-glass) layer can be used. The BPSG layer can be formed by chemical vapor deposition and the SOG can be coated onto the substrate by a spinning process. Both layers can be formed with a planar top surface by the good flowing characteristics.

The trench isolation before planarization includes a nitride layer 14 formed on the substrate 10. A shallow trench 20 with a first opening is formed in the substrate and the nitride layer. A deep trench 24 with a second opening is formed in the bottom of the first trench and extending into the substrate, wherein the width of the first opening is wider than that of the second opening, a depth of the deep trench is deeper than that of the shallow trench. An oxide layer 12 for relieving a stress is lying on the surface of the deep trench, on the lower part of the shallow trench and between the interface of the substrate 10 and the nitride layer 14. An oxynitride layer 28 is formed along the upper surface of the nitride layer 14, the surface of the shallow trench and along the surface of the oxide layer 12 formed on the surface of the deep trench 24. A polysilicon plug 30 is refilled in the deep trench 24. A further oxide layer 32 is refilled into the shallow trench and on the upper surface of the oxynitride layer 28 that lying on the nitride layer 14 and a filling layer 34 is formed on the oxide layer 32.

Figure 9:
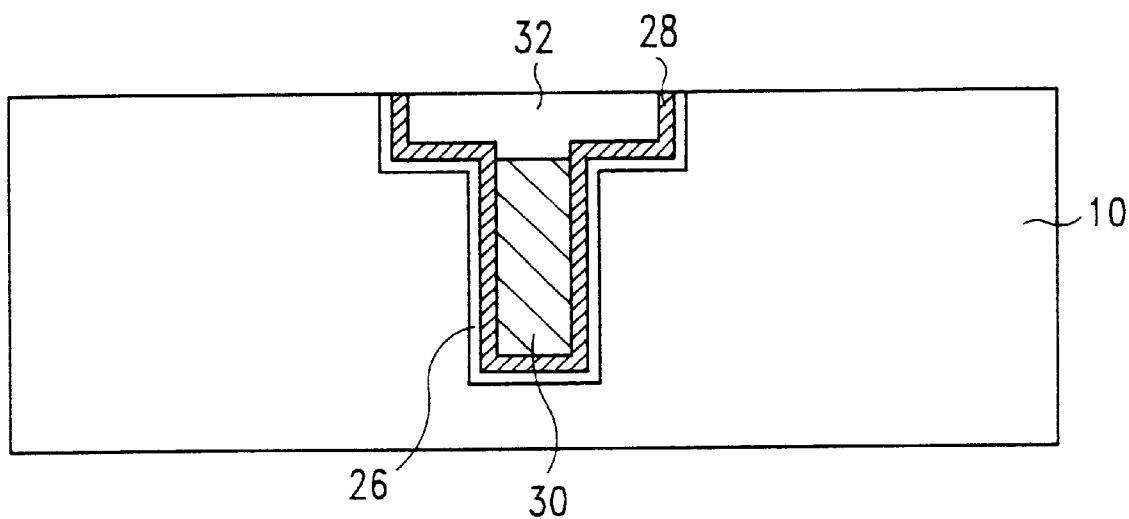
FIG. 9 illustrates a cross-sectional view of planarizing the substrate in accordance with the present invention.

The substrate 10 is then planarized down to the top surface of the substrate 10, as shown in FIG. 9. A chemical-mechanical polishing (CMP) process can be used. The filling layer 34, the first stacked layer 14, the pad layer 12, a portion of the thermal oxide layer 32, and a portion of the oxynitride layer 28 are removed and a planar top surface is achieved.

The trench isolation structure in FIG. 9 has the following elements. A lower portion trench is in the substrate 10. An upper portion trench in the substrate 10 is located above the lower portion trench and the upper portion trench has a larger width than the lower portion trench. A first insulating layer 26 is right above the lower portion trench and the upper portion trench. A second insulating layer 28 is located over the first insulating layer 26. A semiconductor layer 30 is within the lower portion trench over a portion of the second insulating layer 28. A third insulating layer 32 is located on the second insulating layer 28 and the semiconductor layer 30 and is located within the upper portion trench. The upper portion trench and the lower portion trench are combined to form a "T"-shape trench, as shown in the figure.

Therefore, a planarized deep-shallow trench isolation is formed and the structure is provided. The method in the present invention is applied with only one mask used. The efforts and cost of using two or more masks in the conventional trench isolation process can be reduced. The packing density and latch-up immunity of CMOS/bipolar circuits with the trench isolation structure can be improved. The substrate 10 with the planarized deep-shallow trench isolation is then used to form the CMOS/bipolar devices on the active region with the improved latch-up immunity.

As is understood by a person skilled in the art, the foregoing description of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A trench isolation before planarization formed on a substrate, said trench isolation comprising:

a nitride layer formed on said substrate;

a first trench with a first opening having a first width formed in said substrate and said nitride layer;

a second trench with a second opening having a second width formed in the bottom of said first trench and extending into said substrate, wherein said second width is narrower than said first width, a depth of said second trench is deeper than that of said first trench;

a first oxide layer for relieving a stress lying on the surface of said second trench, on the lower part of said first trench and between the interface of said substrate and said nitride layer;

an oxynitride layer acting as an oxidation buffer to improve the isolation formed along the upper surface of said nitride layer, the surface of said first trench and along the surface of said first oxide layer formed on the surface of said second trench;

a polysilicon plug refilled in said second trench;

a second oxide layer refilled into said first trench and on the upper surface of said oxynitride layer that lying on said nitride layer; and a filling layer formed on said second oxide layer for said planarization.

2. The trench isolation of claim 1, wherein said filling layer comprises BPSG.

3. The trench isolation of claim 1, wherein said filling layer comprises SOG.

* * * * *